(12) United States Patent
Lou et al.

(10) Patent No.: US 7,227,416 B2
(45) Date of Patent: Jun. 5, 2007

(54) CURRENT MIRROR WITH LOW STATIC CURRENT AND TRANSCONDUCTANCE AMPLIFIER THEREOF

(75) Inventors: Chih-Hong Lou, Hsinchu (TW); Chia-Chun Liu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 168 days.

(21) Appl. No.: 11/075,655

(22) Filed: Mar. 10, 2005

(65) Prior Publication Data
US 2006/0125566 A1    Jun. 15, 2006

(30) Foreign Application Priority Data
Dec. 15, 2004 (TW) ............................. 93139017 A

(51) Int. Cl.
*H03F 3/04* (2006.01)

(52) U.S. Cl. ..................................... 330/288

(58) Field of Classification Search ............... 330/288; 323/315–316
See application file for complete search history.

(56) References Cited

U.S. PATENT DOCUMENTS

| | | | | |
|---|---|---|---|---|
| 4,727,309 A | * | 2/1988 | Vajdic et al. | ............... 323/315 |
| 5,359,296 A | * | 10/1994 | Brooks et al. | .............. 330/288 |
| 5,835,994 A | * | 11/1998 | Adams | ....................... 323/315 |
| 5,854,574 A | | 12/1998 | Singer et al. | |
| 6,531,915 B2 | * | 3/2003 | Behzad et al. | .............. 327/543 |
| 6,617,915 B2 | | 9/2003 | Rajan | |
| 6,803,808 B2 | * | 10/2004 | Wu | ........................... 327/538 |
| 6,825,710 B2 | * | 11/2004 | Moyal | ........................ 327/543 |

* cited by examiner

*Primary Examiner*—Robert Pascal
*Assistant Examiner*—Nguyen Hieu

(57) ABSTRACT

A current mirror with a transconductance amplifier containing the current mirror with a low static current. The current mirror includes: a load with first end and a second end, the first end coupling to a first input current and a fixed voltage difference existing between the first and second ends; a first transistor, whose drain is coupled to the second end of the load, whose gate is coupled to the first end of the load, and whose source is coupled to a second input current; and a second transistor, whose drain is coupled to a third port and an output current, whose gate is coupled to the second end of the load, and whose source is coupled to the ground. The transconductance amplifier contains: a voltage amplifier stage, a transconductance stage, and a current amplifier stage for amplifying the current and containing the current mirror.

6 Claims, 9 Drawing Sheets

US 7,227,416 B2

CURRENT MIRROR WITH LOW STATIC CURRENT AND TRANSCONDUCTANCE AMPLIFIER THEREOF

BACKGROUND OF THE INVENTION

1. Field of Invention

The invention relates to a current mirror and a transconductance amplifier containing the current mirror. In particular, the invention relates to a current mirror with a low static current and a transconductance amplifier containing the current mirror with a low static current.

2. Related Art

The current mirror is a basic and important analog device, widely used in bias circuits and the loads in an amplifier stage.

As shown in FIG. 1, a conventional current mirror has a first transistor $M_1$ and a second transistor $M_2$. The drain of $M_1$ is coupled to its gate, and its source is coupled to the ground. The gate of $M_2$ is coupled to the gate of $M_1$, and its source is coupled to the ground. The first transistor $M_1$ receives an input current $I_{in}$ via the drain and generates a bias at the gate. The second transistor $M_2$ generates an output current $I_{out}$ at the drain. This current mirror is limited by small signal space and low output impedance.

As shown in FIG. 2, another conventional current mirror has in addition a third transistor $M_3$ and a fourth transistor $M_4$. The source of $M_3$ is coupled to the drain of $M_1$. The source of $M_4$ is coupled to the drain of $M_2$. The gates of the third transistor $M_3$ and the fourth transistor $M_4$ are coupled to a bias voltage $V_{bias}$. The gate of $M_2$ and the gate of $M_1$ are coupled to the drain of the third transistor $M_3$, which receives an input current $I_{in}$. The fourth transistor $M_4$ generates an output current $I_{out}$ at its drain. This current mirror can increase the output impedance, but still suffers from the restriction of small signal space.

FIG. 3 shows yet another current mirror in the prior art. The drain of the first transistor $M_1$ receives an input current $I_{in}$. The drain of the third transistor $M_3$ receives a bias current $I_{bias}$. The current mirror only requires a voltage drop from the drain to the source in order to operate. Therefore, it has a larger signal space. However, it needs a continuous supply of the bias current $I_{bias}$, rendering a larger power loss.

FIG. 4 shows a transconductance amplifier in the prior art. It has a voltage input and a current output. Since the transconductance amplifier can provide a large current output, it is often used to drive a large capacity load $C_L$ to obtain a high slew rate. The output stage of the transconductance amplifier can be stage A or AB. The output stage A consumes a larger static current, resulting in unnecessary power loss. The output stage AB consumes a smaller static current. Nevertheless, it has a dead zone and no large slew rate can be produced with a small input voltage.

The U.S. Pat. No. 5,854,574 proposes a transconductance amplifier using three stages in series to increase the overall gain. It uses a push-pull output stage accompanied by a current mirror. Without any input signal, it only consumes a very small static current. When there is an input signal, a larger slew rate can be provided. However, this transconductance amplifier has four diode voltage drops between a fixed voltage VDD and the ground GND. Therefore, it cannot operate under a lower voltage supply.

SUMMARY OF THE INVENTION

In view of the foregoing, the invention provides a current mirror with a low static current and uses it in a transconductance amplifier.

An objective of the invention is to provide a current mirror with a low static current to operate under a low voltage supply.

Another objective of the invention is to provide a transconductance amplifier with a low static current and high slew rate. It can operate under a low voltage supply or under different bias currents.

The disclosed current mirror with a low static current contains: a load with a first end and a second end, the first end coupling to a first input current and a fixed voltage difference existing between the first end and the second end; a first transistor, whose drain is coupled to the second end of the load, whose gate is coupled to the first end of the load, and whose source is coupled to the second input current; a second transistor, whose drain is coupled to a second port, whose gate is coupled to the second end of the load, and whose source is coupled to the ground; and a third transistor, whose drain is coupled to a third port and an output current, whose gate is coupled to the second end of the load, and whose source is coupled to the ground.

The disclosed transconductance amplifier contains: a voltage amplifier stage for amplifying the voltage; a transconductance stage coupled to the voltage amplifier stage for converting the voltage to a current; and a current amplifier stage coupled to the transconductance stage for amplifying the current and containing the current mirror with a low static current.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
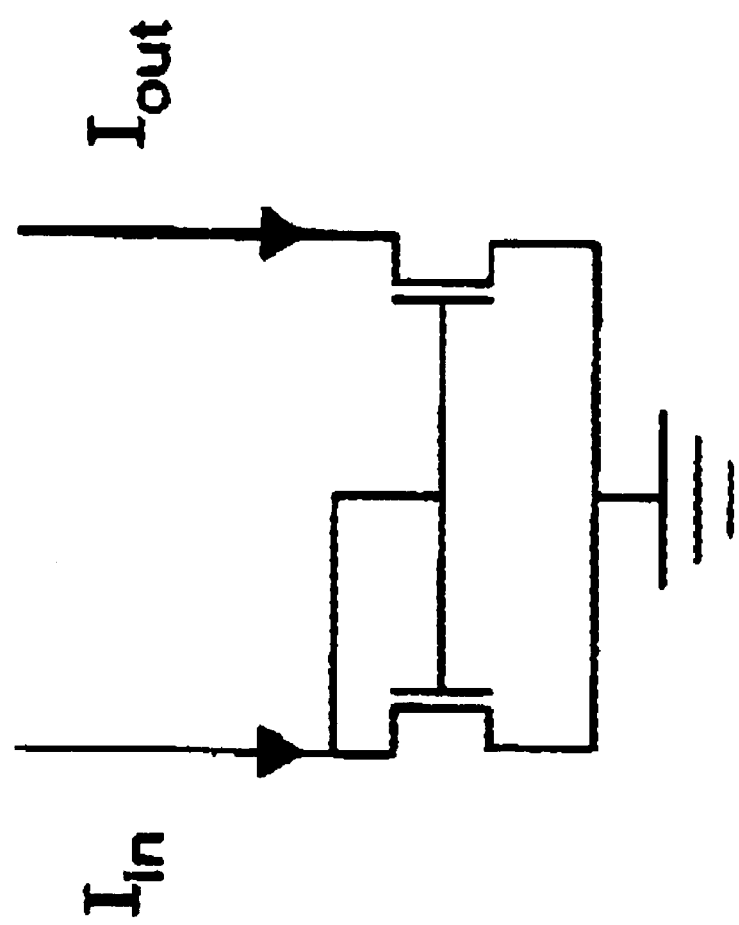
FIG. 1 is a current mirror in the prior art.
Figure 2:
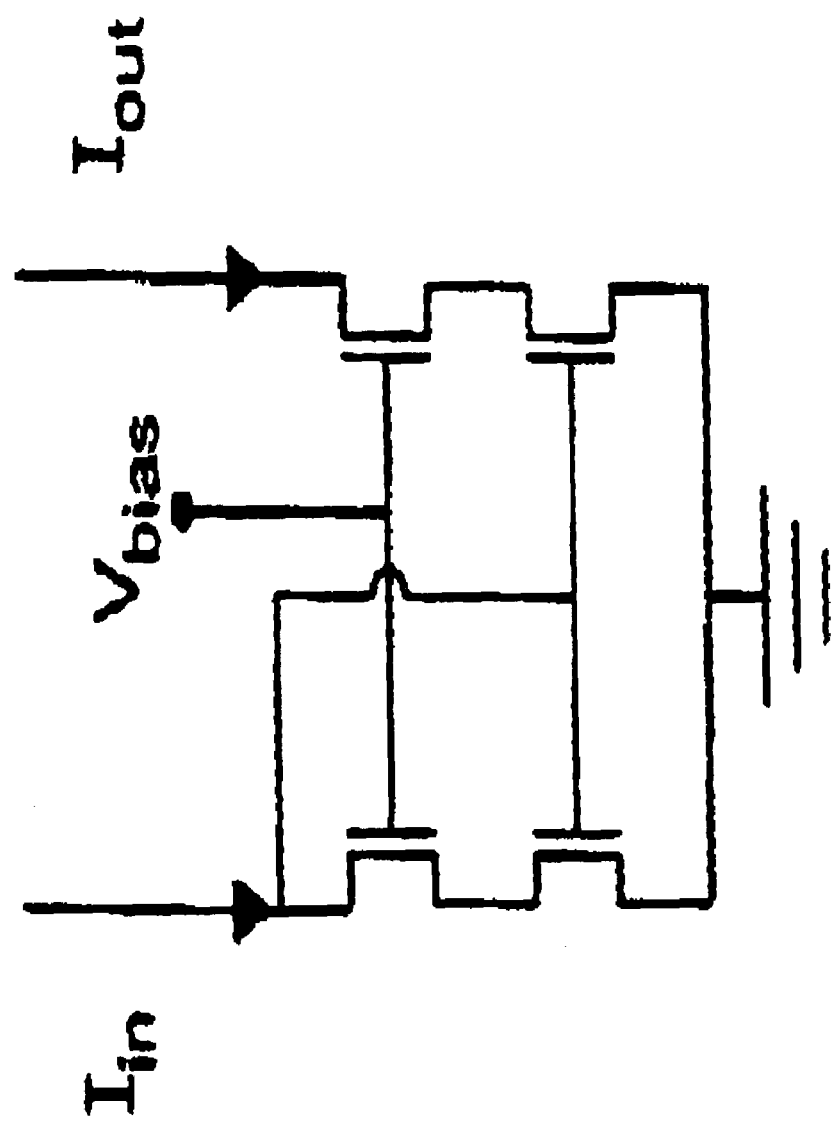
FIG. 2 is another current mirror in the prior art.
Figure 3:
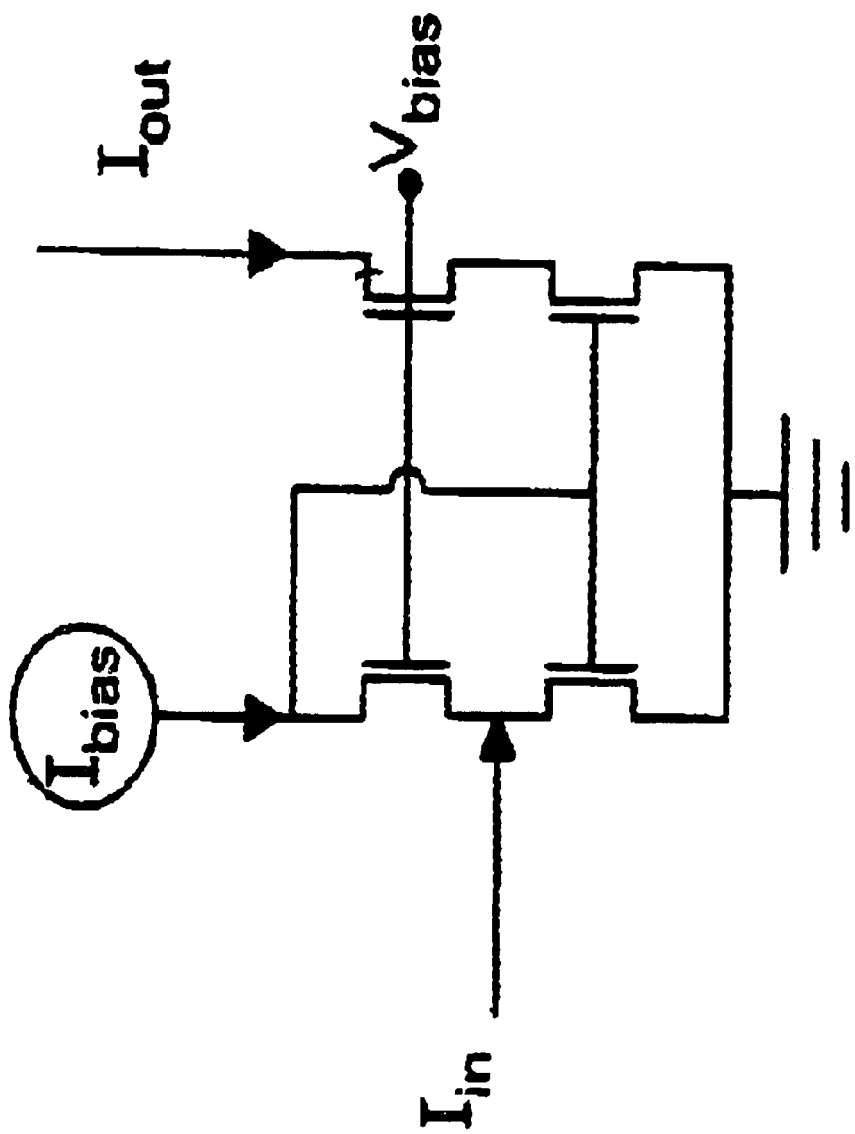
FIG. 3 is yet another current mirror in the prior art.
Figure 4:
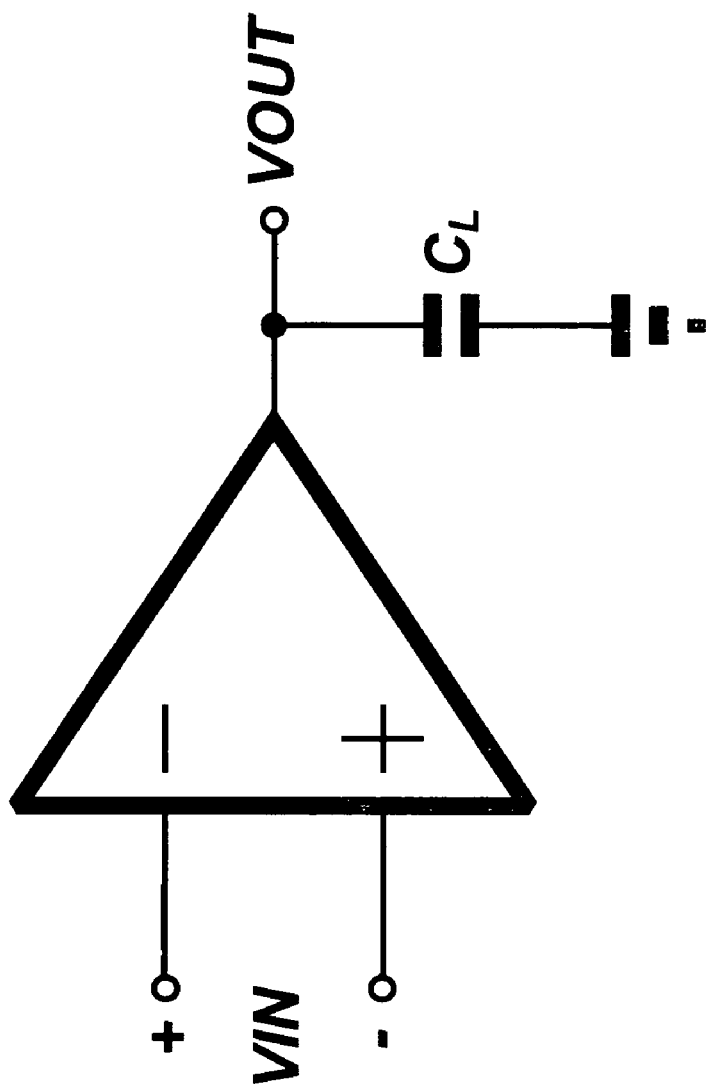
FIG. 4 is a transresistance amplifier in the prior art.
Figure 5:
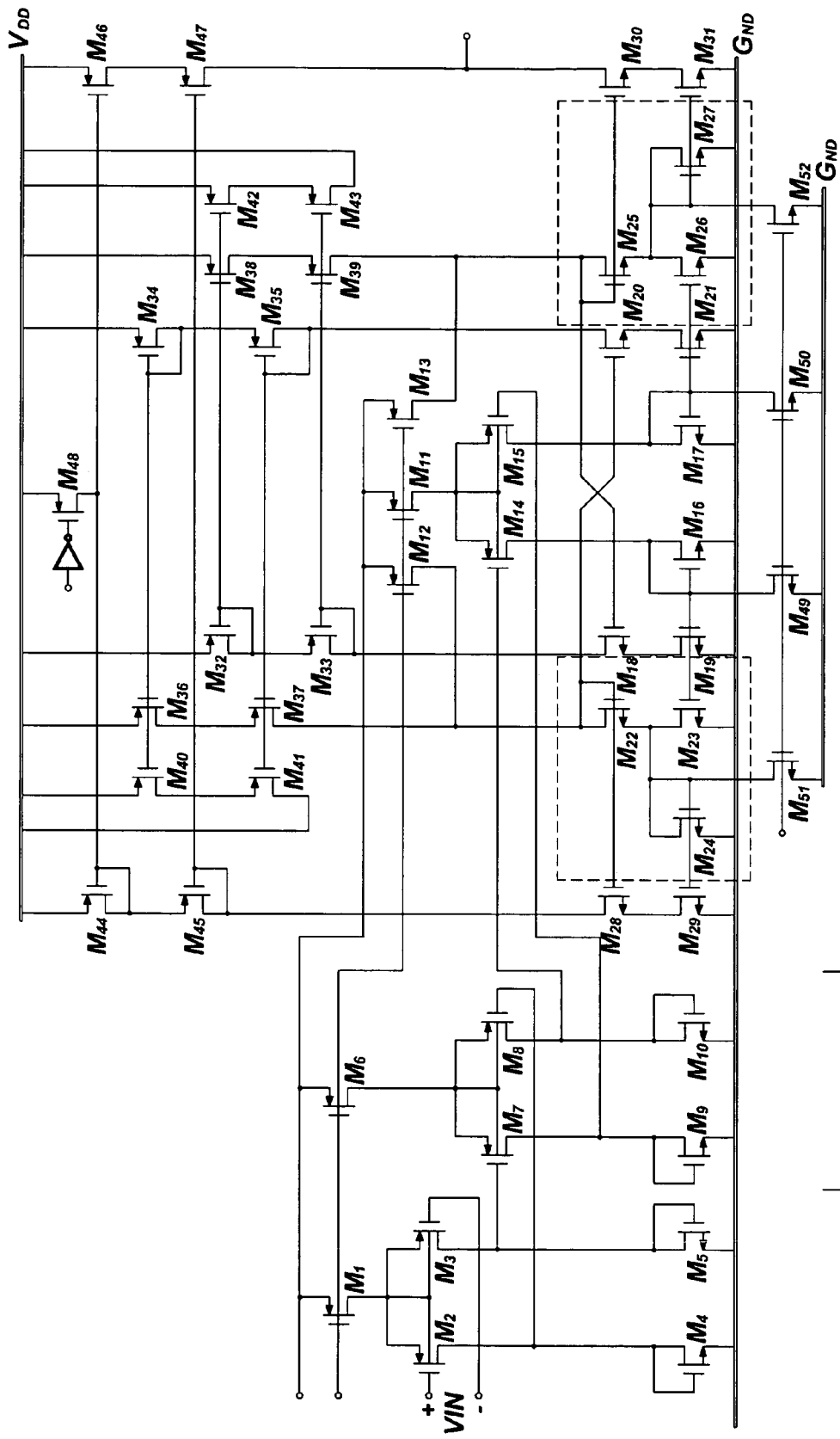
FIG. 5 is another transresistance amplifier in the prior art.
Figure 6:
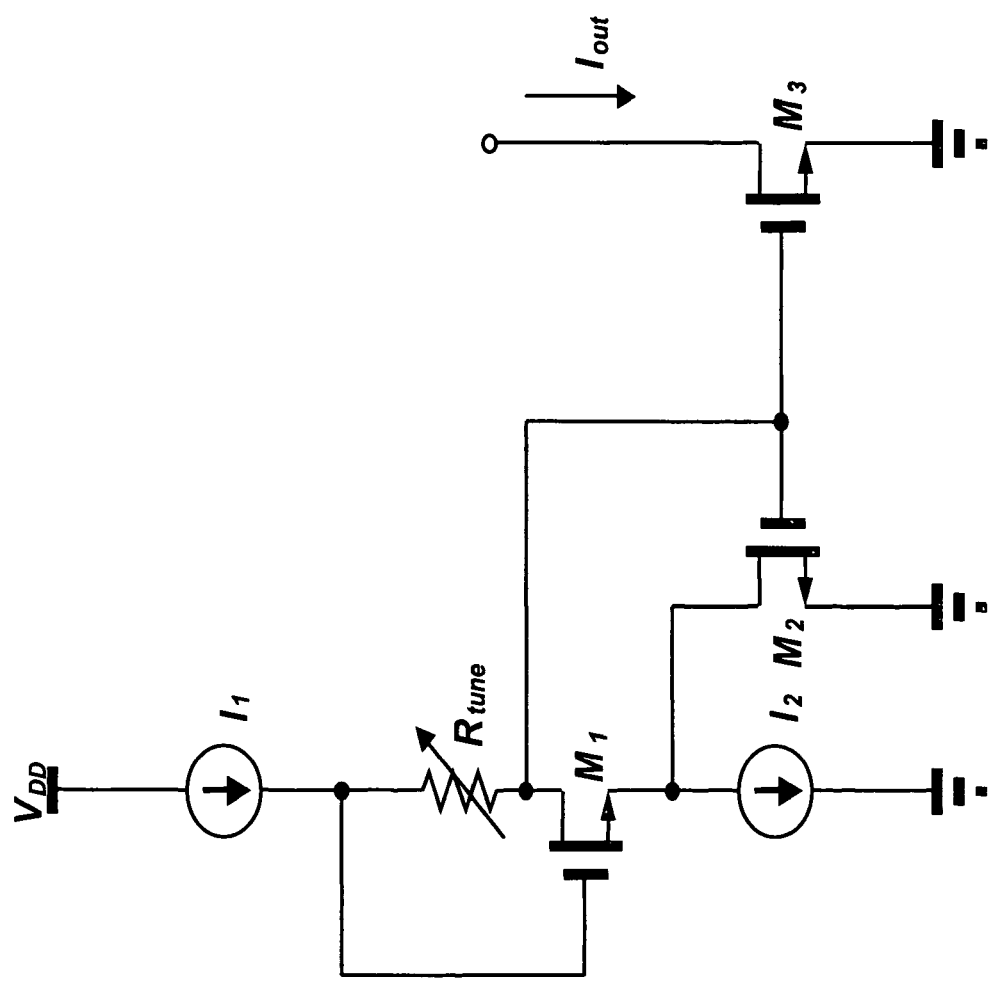
FIG. 6 shows a current mirror with a low static current according to a first embodiment of the invention.

FIG. 6 shows the current mirror with a low static current according to a first embodiment of the invention. The load is a tunable resistor $R_{tune}$. The current mirror 30 with a low static current contains a tunable resistor $R_{tune}$, a first transistor $M_1$, a second transistor $M_2$, and a third transistor $M_3$.

The tunable resistor $R_{tune}$ has a first end and a second end. The first end is coupled to the first input current $I_1$. A fixed voltage difference $V_{DS}$ is supplied between the first and second ends.

The tunable resistor $R_{tune}$ can be made of a metal oxide semiconductor (MOS) operating in the semiconductor linear region.

The drain of the first transistor $M_1$ is coupled to the second end of the tunable resistor $R_{tune}$. Its gate is coupled to the first end of the tunable resistor $R_{tune}$. Its source is coupled to the second input current $I_2$.

The drain of the second transistor $M_2$ is coupled to the source of the first transistor $M_1$. Its gate is coupled to the second end of the tunable resistor $R_{tune}$. Its source is coupled to the ground.

The drain of the third transistor $M_3$ is coupled to a third port. Its drain is also coupled to the input current. Its gate is coupled to the second end of the tunable resistor $R_{tune}$. The source is coupled to the ground.

The difference between the first input current $I_1$ and the second input current $I_2$ is the signal current plus the bias current. When there is no input signal, it is just the bias current. Therefore, the disclosed current mirror has a low static current. The current difference is amplified to be the output current $I_{out}$. The amplification ratio is determined by the second transistor M2 and the third transistor $M_3$.

The first end and the second end of the tunable resistor $R_{tune}$ is maintained at a fixed voltage difference $V_{DS}$. This current mirror can operate under different bias currents.

Since the disclosed current mirror has only one diode voltage drop plus the resistor voltage drop between the fixed voltage VDD and the ground GND, it can operate under a lower voltage supply.

Figure 7:
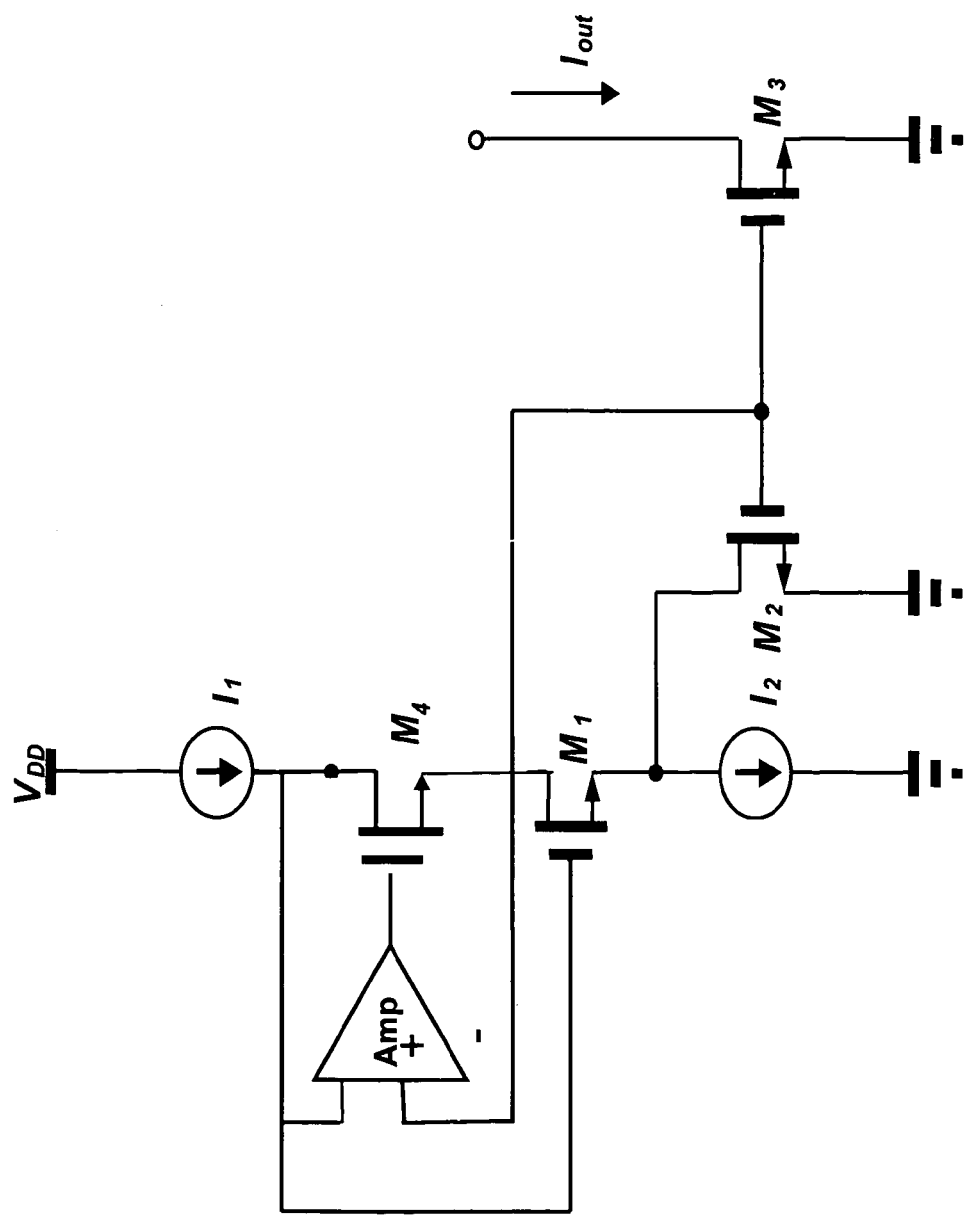
FIG. 7 shows a current mirror with a low static current according to a second embodiment of the invention.
Figure 8:
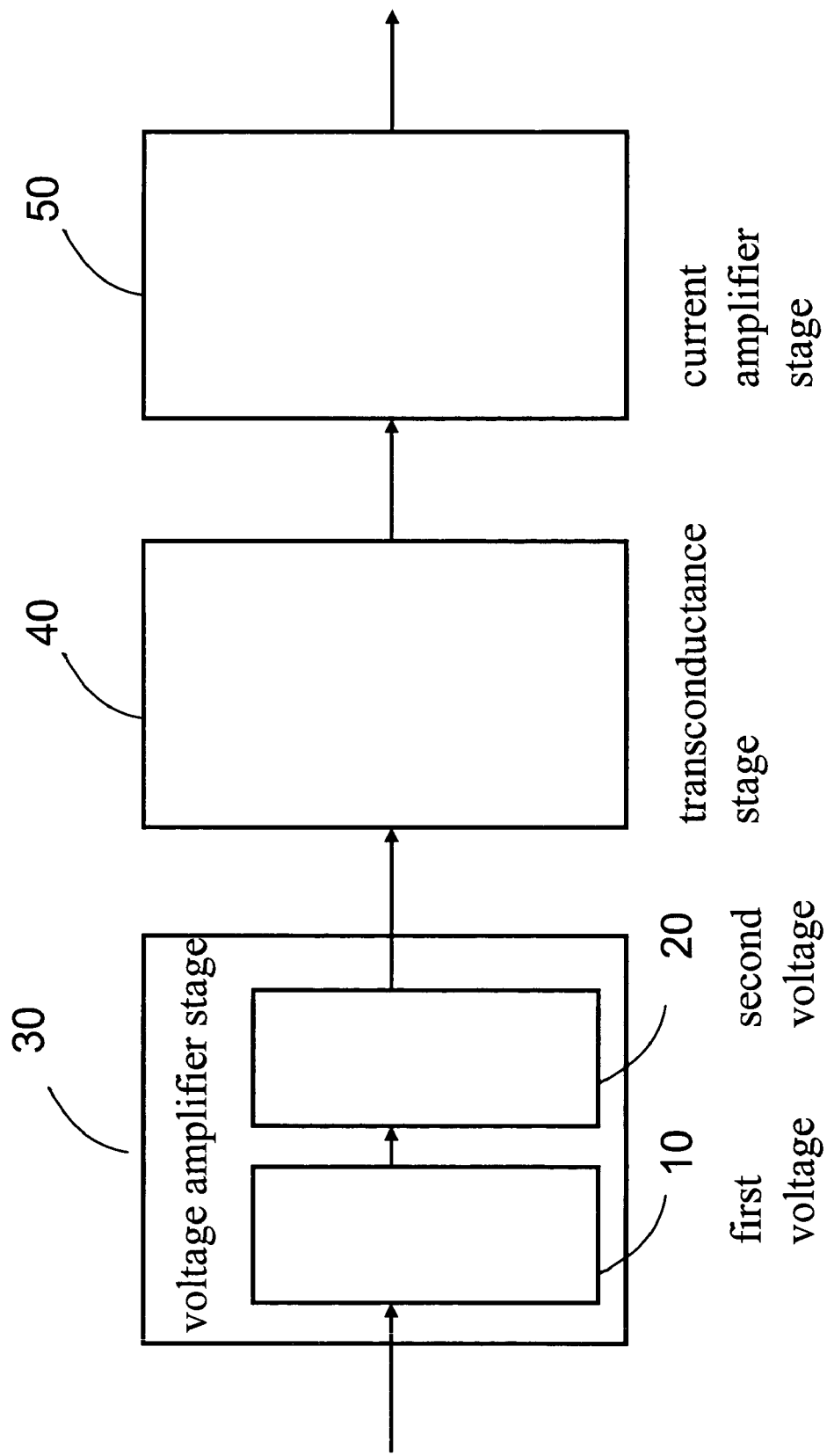
FIG. 8 is a block diagram of the transconductance amplifier according to a third embodiment of the invention.

FIG. 7 shows a second embodiment of the disclosed current mirror with a low static current. In this embodiment, the load is a combination of an amplifier Amp and a fourth transistor $M_4$.

The current mirror 30 with a low static current includes: a first transistor $M_1$, a second transistor $M_2$, a third transistor $M_3$, a fourth transistor $M_4$, and an amplifier Amp.

The amplifier Amp includes a positive input end, a negative input end, and an output end.

The drain of the fourth transistor $M_4$ is coupled to the positive input end of the amplifier Amp. Its gate is coupled to the output end of the amplifier Amp. Its source is coupled to the negative input end of the amplifier Amp.

The drain of the fourth transistor $M_4$ is a first end of the load. Its source is a second end of the load. When the current passing through the fourth transistor $M_4$ changes, a negative feedback mechanism is formed through the connection of the amplifier Amp, adjusting the voltage drop between the drain and source of the fourth transistor $M_4$ to $V_{DS}$.

The drain of the first transistor $M_1$ is coupled to the source of the fourth transistor $M_4$. Its gate is coupled to the drain of the fourth transistor $M_4$. Its source is coupled to the second input current $I_2$.

The drain of the second transistor $M_2$ is coupled to the source of the first transistor $M_1$. Its gate is coupled to the source of the fourth transistor $M_4$. Its source is coupled to the ground.

The drain of the third transistor $M_3$ is coupled to the output current. Its gate is coupled to the drain of the fourth transistor $M_4$. Its source is coupled to the ground.

The difference between the first input current $I_1$ and the second input current $I_2$ is the signal current plus the bias current. When there is no input signal, it is only the bias current. Therefore, the disclosed current mirror has a low static current. The current difference is amplified to the output current $I_{out}$, where the amplification ratio is determined by the second transistor M2 and the third transistor $M_3$.

Since the drain and the source of the fourth transistor M4 is maintained at a fixed voltage difference $V_{DS}$, the current mirror can operate under different bias currents.

Since there are only two diode voltage drops between the fixed voltage VDD and the ground GND, the current mirror can still operate under a lower voltage supply.

Figure 9:
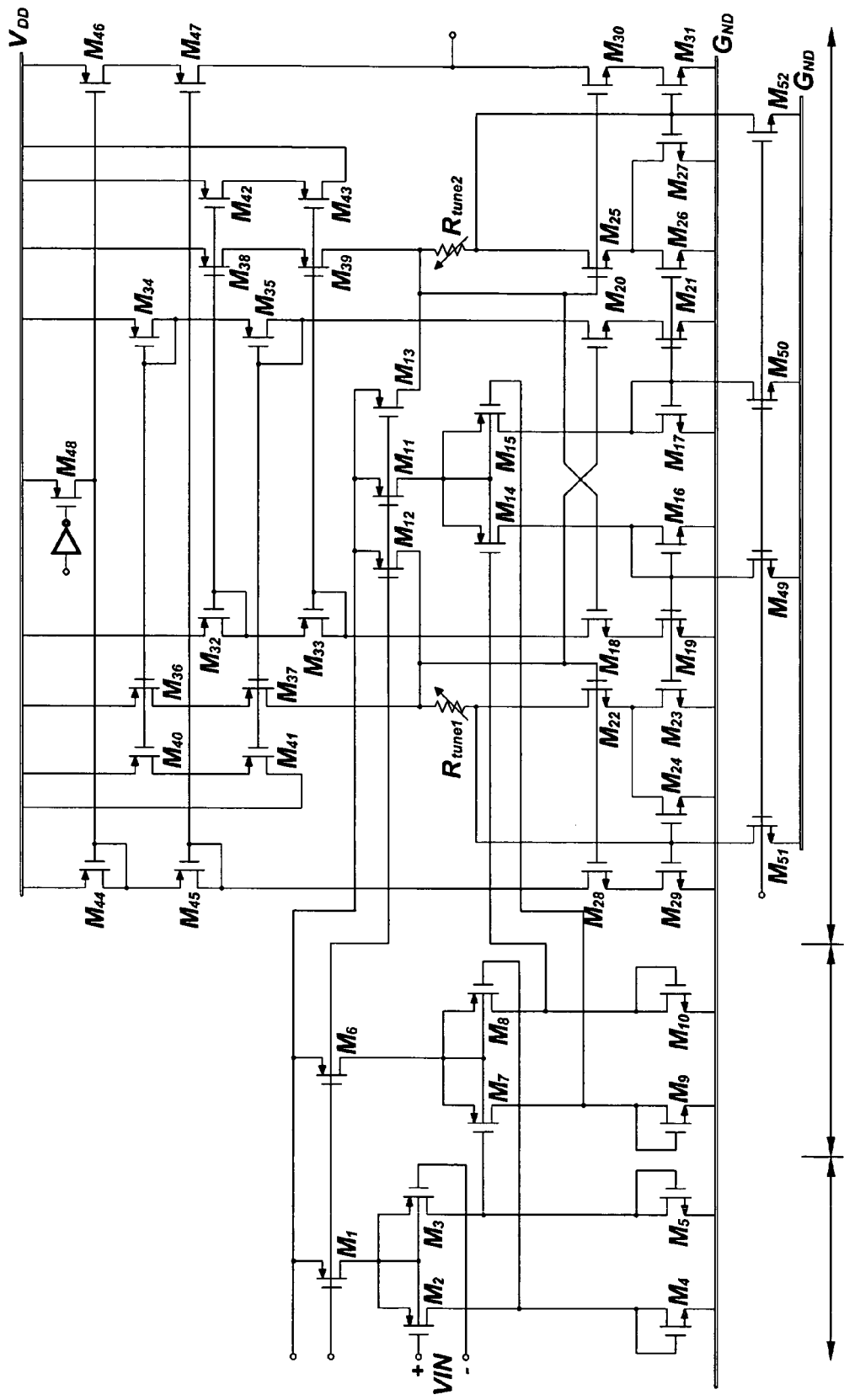
FIG. 9 is a circuit diagram of the transconductance amplifier according to a first embodiment of the invention.

FIG. 9 shows a block diagram of the transconductance amplifier in a third embodiment of the invention. The transconductance amplifier contains: a voltage amplifier stage 30, a transconductance stage 40, and a current amplifier stage 50.

The voltage amplifier stage 30 amplifies the voltage. The transconductance stage 40 is coupled to the voltage amplifier stage 30 to convert the voltage into a current. The current amplifier stage 50 is coupled to the transconductance stage to amplify the current. It contains a current mirror with a low static current that is used as a reference buffer at a low voltage or as a current driver.

FIG. 10 shows the circuit diagram of the transconductance amplifier in the third embodiment. The voltage amplifier stage 30 contains: a first voltage amplifier 10 and a second voltage amplifier 20 coupled with each other.

The first voltage amplifier 10 contains: a first input differential pair and a first load differential pair. The transistors $M_2$ and $M_3$ form the first input differential pair. The transistors $M_4$ and $M_5$ form the first load differential pair.

The second voltage amplifier 20 contains: a second input differential pair and a second load differential pair. The transistors $M_2$ and $M_3$ form the second input differential pair. The transistors $M_4$ and $M_5$ form the second load differential pair.

The transistors $M_{22}$ to $M_{24}$ form one current mirror with a low static current. The transistors $M_{25}$ to $M_{27}$ form another current mirror with a low static current.

Certain variations would be apparent to those skilled in the art, which variations are considered within the spirit and scope of the claimed invention.

What is claimed is:

1. A current mirror with a low static current for amplifying the difference between a first input current and a second input current into an output current, comprising:

a load, which has a first end coupling to the first input current and a second end with a fixed voltage difference imposed in between;

a first transistor, whose drain is coupled to the second end of the load, whose gate is coupled to the first end of the load, and whose source is coupled to the second input current;

a second transistor, whose drain is coupled to a second port, whose gate is coupled to the second end of the load, and whose source is coupled to the ground; and a third transistor, whose drain is coupled to a third port and the output current, whose gate is coupled to the second end of the load, and whose source is coupled to the ground.

2. The current mirror of claim 1, wherein the load includes a tunable resistor whose resistance is adjusted according to the bias current to provide a fixed voltage difference.

3. The current mirror of claim 2, wherein the tunable resistor is a metal oxide semiconductor (MOS) operating in the linear region of the semiconductor.

4. A transconductance amplifier comprising:

a voltage amplifier stage for amplifying a voltage;

a transconductance stage coupled to the voltage amplifier stage for converting the voltage into a current; and a current amplifier stage coupled to the transconductance stage and containing a current mirror with a low static current for amplifying the difference between a first input current and a second input current, the current mirror including:

a load, which has a first end coupling to the first input current and a second end with a fixed voltage difference imposed in between;

a first transistor, whose drain is coupled to the second end of the load, whose gate is coupled to the first end of the load, and whose source is coupled to the second input current;

a second transistor, whose drain is coupled to a second port, whose gate is coupled to the second end of the load, and whose source is coupled to the ground; and a third transistor, whose drain is coupled to a third port and the output current, whose gate is coupled to the second end of the load, and whose source is coupled to the ground.

5. The transconductance amplifier of claim 4, wherein the load includes a tunable resistor whose resistance is adjusted according to the bias current to provide a fixed voltage difference.

6. The transconductance amplifier of claim 5, wherein the tunable resistor is a metal oxide semiconductor (MOS) operating in the linear region of the semiconductor.

* * * * *